(12) United States Patent
Minoshima

(10) Patent No.: US 6,368,208 B1
(45) Date of Patent: Apr. 9, 2002

(54) CLEANROOM AND CLEANROOM VENTILATION METHOD

(75) Inventor: Masahiko Minoshima, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/668,946

(22) Filed: Sep. 22, 2000

(30) Foreign Application Priority Data

Sep. 24, 1999 (JP) .......................................... 11-270464

(51) Int. Cl.[7] ................................................ F24F 7/06
(52) U.S. Cl. ...................................... 454/187; 414/435
(58) Field of Search .......................... 454/187; 414/217, 414/935, 937, 940; 55/385.2

(56) References Cited

U.S. PATENT DOCUMENTS

| | | | | |
|---|---|---|---|---|
| 5,912,184 A | * | 6/1999 | Young | 454/187 X |
| 5,997,398 A | * | 12/1999 | Yamada et al. | 454/187 |
| 6,080,060 A | * | 6/2000 | Larsson | 454/187 |

FOREIGN PATENT DOCUMENTS

| | | | | |
|---|---|---|---|---|
| JP | 61-24933 | * | 2/1966 | ................. 454/187 |
| JP | 60-140034 | * | 7/1985 | ................. 454/187 |
| JP | 3-177732 | * | 8/1991 | ................. 454/187 |
| JP | 4-80538 | | 3/1992 | |
| JP | 7-45581 | | 12/1995 | |
| JP | 9-148294 | | 6/1997 | |
| JP | 10-238833 | | 9/1998 | |

* cited by examiner

*Primary Examiner*—Harold Joyce
(74) *Attorney, Agent, or Firm*—Hayes Soloway P.C.

(57) ABSTRACT

A cleanroom has an inner chamber inside of which are disposed prescribed semiconductor device production equipment, an interface box, and an interface box opener and the like, and an outer chamber which surrounds the inner chamber, and which forms an air circulation path between itself and the inner chamber, wherein air inside the inner chamber circulates in the air circulation path via a fan filter unit provided in the inner chamber, a clean second air flow, independent from the first air flow circulating in the inner chamber and air circulation path, being directly supplied to a region near the interface box opener from the outside of the cleanroom.

23 Claims, 3 Drawing Sheets

CLEANROOM AND CLEANROOM VENTILATION METHOD

BACKGROUND OF THE INVENTION

1. Field of the Invention

The present invention relates to a cleanroom and a method for ventilation of a cleanroom, and more particularly to a cleanroom and method for ventilation of a cleanroom for use in the process of manufacturing a semiconductor device, and particularly a cleanroom and cleanroom ventilation method for providing localized cleaning of dust, impurities, and chemical substances of air in a contaminated region.

2. Background of the Invention

In a process for manufacturing a semiconductor device of the past, a cleanroom is generally used to prevent contamination of a wafer by dust and other impurities or chemical substances or the like in the air, thereby preventing a worsening of the characteristics of the final product and the occurrence of failed products.

A cleanroom 1 of the past, as shown in FIG. 3, is often made up by an outer chamber 20 and an inner chamber 10, and within the inner chamber 10 are provided a semiconductor production apparatus 2, a movable interface box 4 containing wafers 3 that are to be processed by the semiconductor production apparatus 2, and an interface box opener 5 mounted in a fixed manner to the interface box 4, which transports wafers 3 to within the production apparatus 2 from within the interface box 4. In the interface box type cleanroom 1, an integral fan-filter unit (hereinafter referred to as an FFU) 7 made up of a fan 8 and a filter 9 is installed at the top part of the interface box opener 5 in the inner chamber 10, a chemical filter 6 being further installed at the top of the FFU 7, wherein after removing specific components from the atmosphere within the inner chamber 10 of the cleanroom 1, a clean air flow is introduced into the interface box opener 5.

External air supplied form an external air adjusting apparatus 14 is first introduced into an air circulation path formed between the inner chamber 10 and the outer chamber 20, and via FFU 7 configured as noted above disposed at a prescribed spacing therebetween on the ceiling of the inner chamber, this air is introduced into the inner chamber 10, the air having been introduced into the inner chamber 10 then circulating from exhaust holes 28 provided in the floor 40 of the inner chamber 10 to an air circulation path 12, thereby circulating in the above-noted flow path.

In the present invention, the above-noted air flow will be referred to as the first air flow.

An appropriate air cooling means 17 can be provided inside the air circulation path 12, and further, because of the need to monitor the external air pressure of the cleanroom 1 and the internal air pressure of the inner chamber 10 with a sensor 16 and a detector 15 and to make the air pressure within the inner chamber 10 be greater than the external air pressure by a prescribed amount at all times, the difference between the air pressures is detected as noted above and, then the pressure difference falls below a prescribed pressure, an external air adjustment apparatus 14 is driven, so as to introduce external air into the air circulation path 12.

Control is performed so as to mix external air upstream of the FFU 7, the amount thereof being controlled so that the difference between the pressure within the cleanroom and the external chamber is maintained constant.

In the prior art, in order to perform localized cleaning of the air in a region that includes the interface box opening 5 that removes a wafer held within the interface box 4, in which there is a high possibility of contamination of the wafers 3 within the cleanroom 1, a hole was formed in the cover of the interface box 4, and an FFU 7 was provided separately from the FFUs on the ceiling of the inner chamber 10, a chemical filter 6 being provided in the FFU 7 to clean this air flow.

However, chemical substances, and particularly organic components used in processing that can scatter within the cleanroom can be included in the circulating air, and in processing even organic components that are singularly not a problem during processing, due to a catalytic action of chemical filter attraction agents and activated charcoal, break down, causing the occurrence of byproducts.

For example, even chemical substances used in the semiconductor device manufacturing processes are broken down by, for example, the catalytic action of the phosphoric acid attraction agent of the activated-charcoal chemical filter or activated charcoal, and depending upon the concentration thereof, these could influence a semiconductor device manufacturing process.

In the above-noted prior art, there is a possibility that the above-noted components intrude into the interface box opener 5, and when the opener of the interface box 4 is opened and closed, there is a possibility of being pulled into the atmosphere thereof, thereby adversely affecting the wafers 3 therein.

Then, some relevant prior art references will be explained as follows.

In the Japanese Unexamined Patent Application publication H4-80538 as a first reference, there is disclosure of a cleanroom using a removal filter that operates only when there is a leak of a chemical or gas or the like within the cleanroom.

The first reference intends to prevent medicine mist, etc., from being diffused into a clean room by mounting a detriment removing agent in an air conditioner return port, normally bypassing circulating air, switching a shutter at the time of leakage of medicine, etc., and passing it through a detriment removing agent filter. Nevertheless, there is no disclosure of technology for locally exposing a specific location within the cleanroom to a clean air flow.

In the Japanese Unexamined Patent Application publication H7-45581 as a second reference, a semiconductor substrate chemical treater is disclosed, which reduces the amount of the air to be fed for maintaining the cleanness of a chemical treating part in a semiconductor substrate chemical treater, and to miniaturize the scale of an air-handling system for air feed. Nevertheless, in the second reference, there is only disclosure of a configuration using an air flow for preventing the evaporation and scattering of a processing chemical in a semiconductor device processing apparatus, but no disclosure of technology for locally exposing a specific location within the cleanroom to a clean air flow.

In the Japanese Unexamined Patent Application publication H9-148294 as a third reference, a substrate processor is disclosed, which is directed to efficiently supply down flow and to reduce running cost by effectively using exhaust which does not contain chemical, In the third reference, there is only disclosure of a method of circulating an air flow and use of a filter within a cleanroom, but no disclosure of technology for locally exposing a specific location within the cleanroom to a clean air flow.

In addition, in the Japanese Unexamined Patent Application publication H10-238833 as a fourth reference, there is disclosure of a cleanroom having the usual configuration, wherein, during maintenance of part of the production equipment, a movable dividing wall is provided above this part of the production equipment hung from above, simultaneously with the supply of a separate clean air flow within the dividing wall.

However, in the above known example, a considerable large region, including the production equipment, is delineated by the dividing wall, clean air being introduced to therewithin, this apparatus being configured so as to be movable and moved only with respect to production equipment requiring maintenance, stopped at the position thereof, and used to introduce clean air flow thereto, thereby making the apparatus large and requiring it to be operated continuously.

Accordingly, in order to improve on the above-noted drawbacks in the prior art, it is an object of the present invention to provide a low-cost cleanroom and method for ventilating a cleanroom, which greatly reduce the possibility of wafer contamination, and can be expected to improve both semiconductor device quality and yield.

SUMMARY OF THE INVENTION

In order to achieve the above-noted object, the present invention has the following technical constitution.

Specifically, a first aspect of the present invention is a cleanroom configured by an inner chamber inside of which are disposed prescribed semiconductor device production equipment, a movable interface box with a plurality of wafers therewithin, and an interface box opener, fixed on the interface box, which transports wafers to within the production equipment from within the interface box, and an outer chamber which surrounds the inner chamber, and which forms an air circulation path between itself and the inner chamber, wherein air inside the inner chamber circulates in the air circulation path via a fan filter unit provided in the inner chamber, a clean second air flow, independent from the first air flow circulating in the inner chamber and air circulation path, being directly supplied to a region near the interface box opener from the outside of the cleanroom.

A second aspect of the present invention is a method for ventilating a cleanroom configured by an inner chamber inside of which are disposed prescribed semiconductor device production equipment, a movable interface box with a plurality of wafers therewithin, and an interface box opener, fixed on the interface box, which transports wafers to within the production equipment from within the interface box, and an outer chamber which surrounds the inner chamber, and which forms an air circulation path between it and the inner chamber, whereby air inside the inner chamber circulates in the air circulation path via a fan filter unit provided in the inner chamber, a clean second air flow, independent from the first air flow circulating in the inner chamber and air circulation path, being directly supplied to a region near the interface box opener from the outside of the cleanroom.

By adopting the above-noted technical constitution, a cleanroom and cleanroom ventilation method according to the present invention, when a part at which a wafer in the interface box is exposed to the atmosphere in the cleanroom, for example, a part of the interface box opener, is subjected to a flow of air from a chemical filter, to remove a chemical, air from which an impurity has been selectively removed by the chemical filter is supplied to part of the interface box, localized "all-fresh" ventilation being done, in which temperature-adjusted outside air is directly introduced into the chemical filter, thereby removing the influence of broken down substances in the chemical filter from components in the cleanroom atmosphere. By making secondary use of part of the air that has passed through the interface box opener for the purpose of pressurizing the cleanroom, and limiting the all-fresh ventilation to the interface box opener part, it is possible to enable an all-fresh ventilation function without having to providing all-fresh ventilation throughout the entire cleanroom, thereby resulting in an energy savings.

BRIEF DESCRIPTIONS OF THE DRAWINGS

DETAILED DESCRIPTION OF THE PREFERRED EMBODIMENTS

Embodiments of the present invention are described in detail below, with reference made to relevant accompanying drawings.

Figure 1:
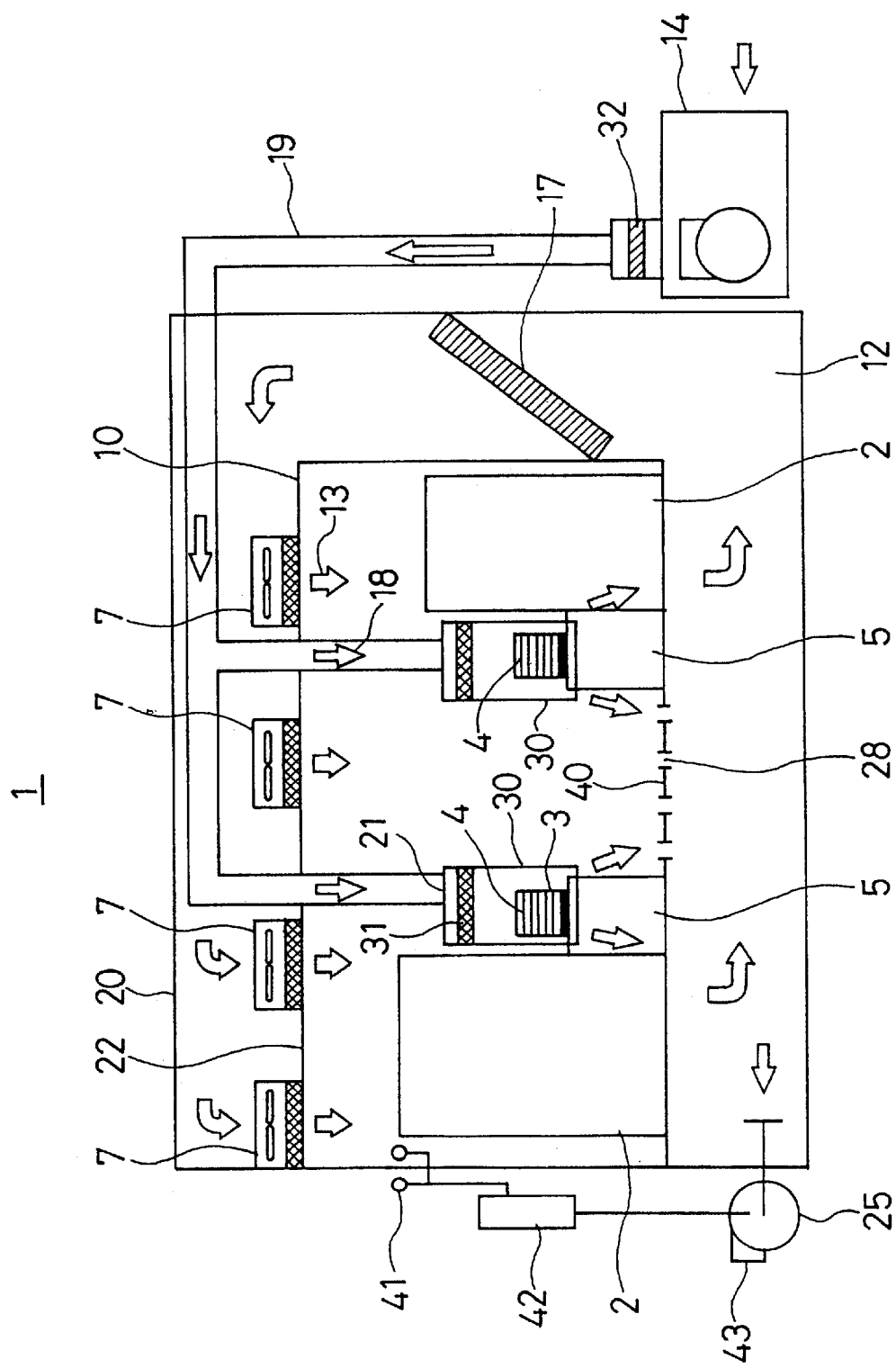
FIG. 1 is a side view showing the configuration of an embodiment of a cleanroom according to the present invention.

Specifically, FIG. 1 shows a cross-sectional view of the configuration of an embodiment of a cleanroom according to the present invention, which is a cleanroom 1 configured by an inner chamber 10 inside of which are disposed prescribed semiconductor device production equipment 2, a movable interface box 4 with a plurality of wafers therewithin, and an interface box opener 5, fixed on the interface box, which transports wafers to within the production equipment 2 from within the interface box 4, and an outer chamber 20 which surrounds the inner chamber 10, and which forms an air circulation path 12 between it and the inner chamber 10, wherein air inside the inner chamber 10 circulates in the air circulation path 12 via a fan filter unit 7 provided in the inner chamber 10, a clean second air flow 18, independent from the first air flow 13, circulating in the inner chamber 10 and air circulation path 12, being directly supplied to a region near the interface box opener 5 from the outside of the cleanroom 1.

In the above-noted cleanroom 1 according to the present invention, it is desirable that an air exhaust port 21 of an air duct 19 connected to a clean air supply means 14 provided outside the cleanroom 1 be provided and disposed near the interface box opener 5 provided in the inner chamber 10.

It is also desirable that a dividing means 30 that surrounds the interface box 4 resting on the interface box opener 5 be disposed near the interface box opener 5.

It is further desirable in the present invention that appropriate filter 31 be disposed near the connection between the dividing means 30 and the air exhaust port 21 of the air duct 19.

It is preferable in a cleanroom according to the present invention that a filter means 32 be provided at an appropriate location between the air exhaust port 21 and clean air supply means 14 in the air duct 19.

It is preferable that the filter means 32 be a chemical filter means.

Figure 2:
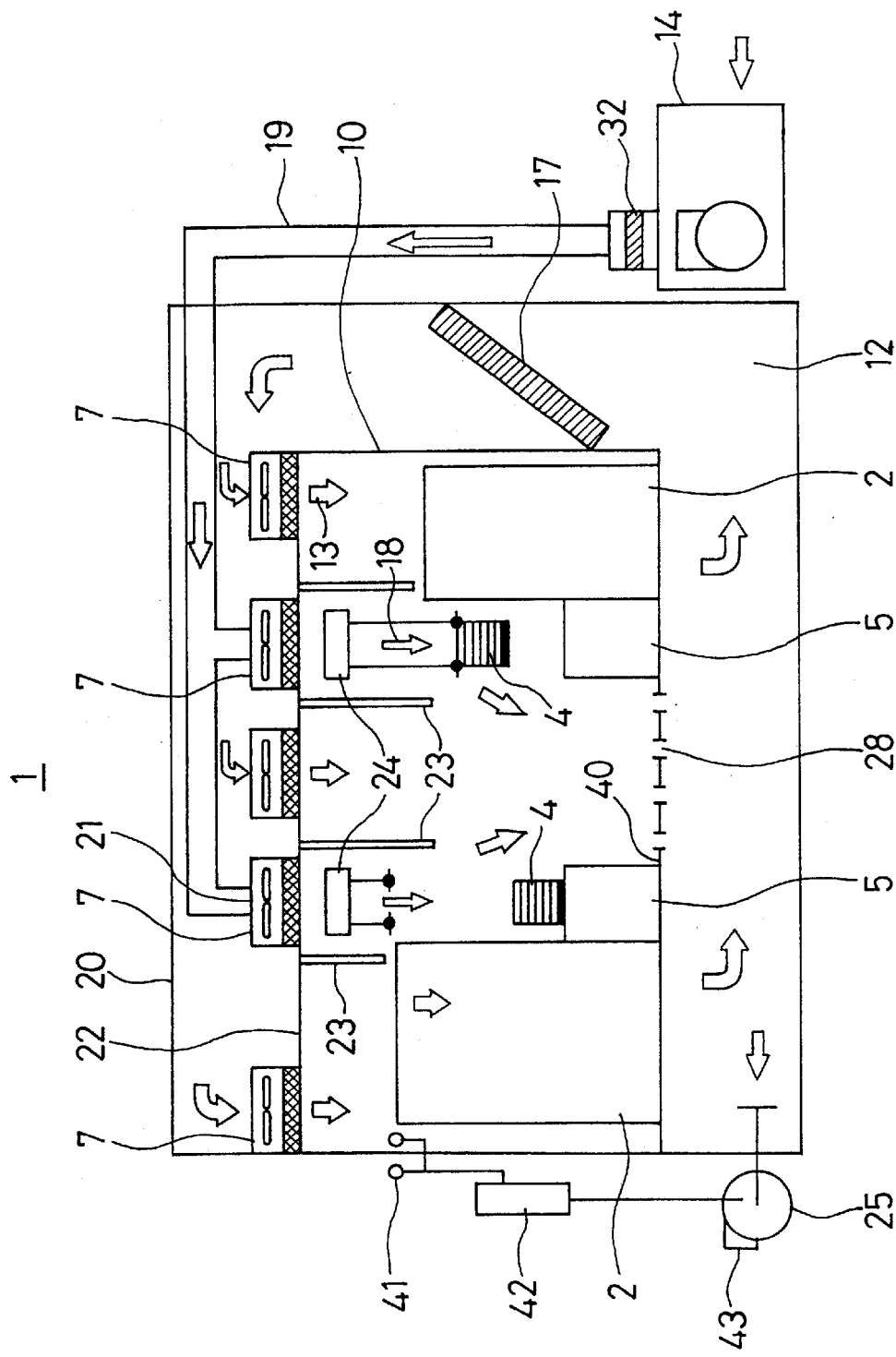
FIG. 2 is a side view showing the configuration of another embodiment of a cleanroom according to the present invention.
Figure 3:
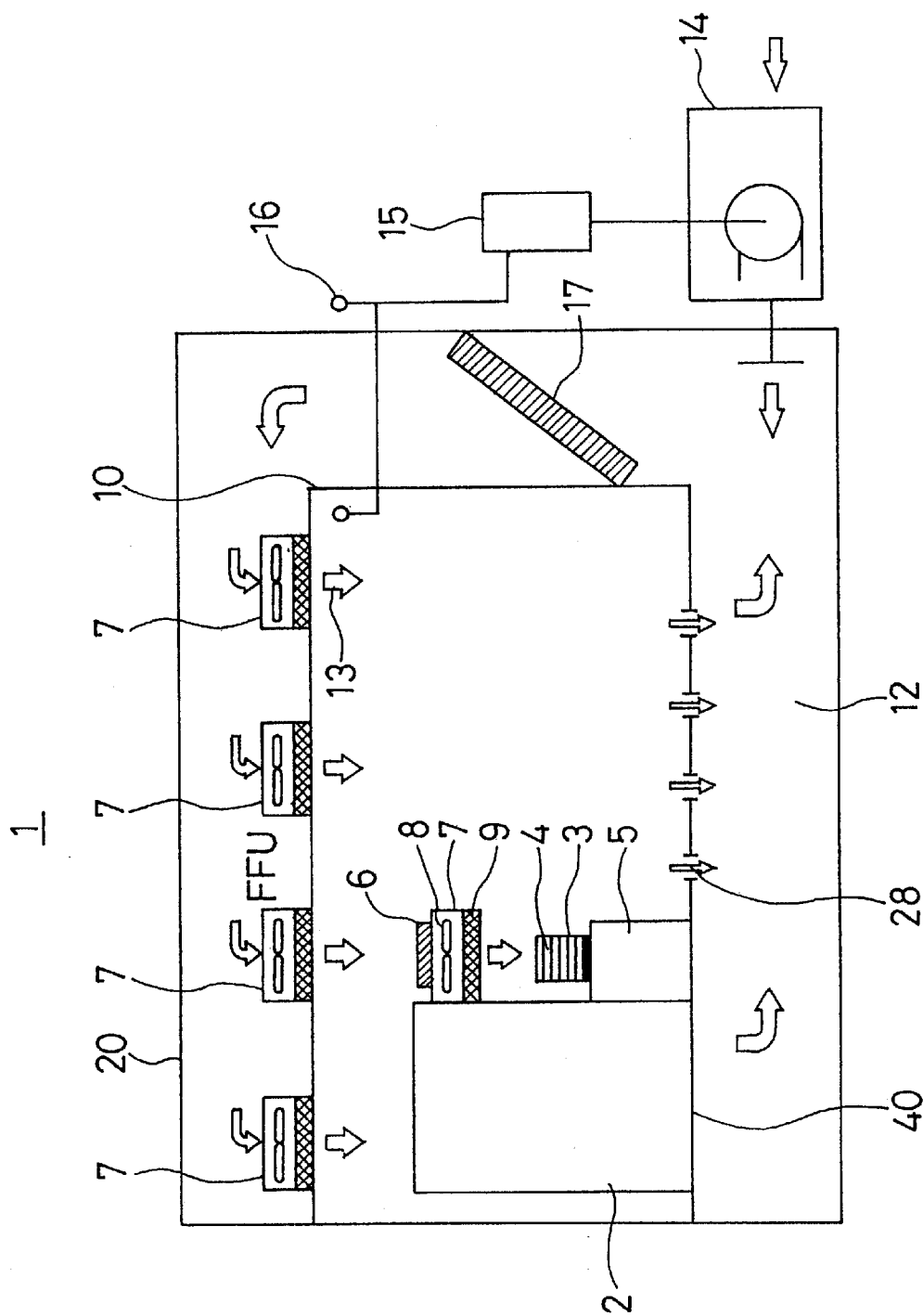
FIG. 3 is side view showing an example of a cleanroom of the past.

Additionally, in another embodiment of the present invention, as shown in FIG. 2, the air exhaust port 21 of the air duct 19 connected to the clean air supply means 14 provided outside of the cleanroom 1 be connected to the ceiling 22 of the inner chamber 10 of the cleanroom 1, and that a dividing means 23 be provided so as to be suspended from the region of the ceiling 22 to which is connected the air exhaust port 21 of the air duct 19 of the cleanroom, above the location of the interface box opener 5.

Although there is no particular restriction to the suspended length of the dividing means 23, it is effective if it has a suspended length of approximately 2 meters from the ceiling 22.

In a cleanroom 1 according to the present invention, it is preferable that a fan filter unit 7 be provided at the location of a connection between air exhaust port 21 of the air duct 19 and the ceiling 22 of the inner chamber 10.

It is preferable that an interface box transport means 24 be provided within the dividing means 23 in the present invention, and it is also possible to have the transport means 24 disposed so as to be suspended from the ceiling 22 of the inner chamber 10.

In the present invention, the first and second air flows 13 and 18 are mixed at the inner chamber 10 or the air circulation path 12, and are supplied for circulation as a first air flow 13 to the inner chamber 10.

In the present invention, it is desirable that an inside air exhaust means 25 be provided, which, upon detection of the air pressure inside the inner chamber 10 and the air pressure outside of the cleanroom, exhausts part of the air in the air circulation path 12 in response to the difference between these pressures.

Additionally, in the present invention it is desirable that an air cooling apparatus 17 be provided in the air circulation path 12.

That is, in a cleanroom and cleanroom ventilation means according to the present invention, in a part inside the interface box 4 at which the wafer 3 is exposed to circulating air 13 within the cleanroom, for example, at the interface box opener 5, and in particular in the case in which air is introduced that is processed by a chemical filter 6 as a measure for preventing the exposure of a wafer 3 in the interface box 4 to chemical components in the circulating air 13, by directly introducing into this part clean outside air with controlled temperature, humidity, and chemicals, by introduction of this chemically controlled air, without causing air used in the cleanroom or cleanroom circulating air that includes chemical components intruding from outside or generated internally through a chemical filter 6, and by performing exhaust control of the air after passing through the above-noted area, it is possible in the cleanroom and cleanroom ventilation method of the present invention to cause air outside the above-noted area to serve also for the purpose of chamber pressurization.

In a ventilation method according to the present invention, there is a chemical filter 32 that removes chemical components, installed at the external ventilation apparatus and external ventilation port that control the temperature and humidity of external air, a dedicated duct 19 that provides a constant supply of clean air after chemical filtering as the second air flow to the interface box opener 5 associated with the production equipment 2 in the inner chamber 10 of the cleanroom, a inner chamber exhaust means 25 formed by a inner chamber exhaust fan and damper or the like for controlling the pressure difference between the inner chamber internal pressure and the external air pressure, a cooling coil 17 for the purpose of controlling the temperature and humidity of circulating air, and a FFU 7 for circulating air within the cleanroom.

The operation of a cleanroom according to an embodiment of the present invention is described below.

Specifically, in a cleanroom according to the present invention external air that is temperature and humidity controlled an external ventilation apparatus, which is the clean air supply means 14, pass through the chemical filter 32 at the exit of the external ventilation apparatus 14, after which the duct 19 provides a direct supply of a second air flow 18 separated from the first air flow 13 in the cleanroom 1 to the interface box opener 5 associated with the production equipment 2.

The second air flow 18 after having passed through the interface box opener 5 is air-returned via holes 28 provided in the floor 40 of the inner chamber 10 of the cleanroom 1, and is mixed with the circulating air that is the first air flow in the cleanroom 1.

Additionally, on the air-returned side are provided, for example, a cleanroom internal/external pressure difference sensor 41, a control means 42 outputting a control signal based on the pressure difference value, and an adjustment means 43 for performing exhaust fan rpm speed control and damper adjustment, based on an output signal from the control means 42.

The configuration of a second embodiment of the present invention as shown in FIG. 2 differs from that of the first embodiment, in that the clean second air flow 18, from which chemicals have been removed, is introduced into one of the row of FFUs 7, provided in parallel to the operating panel of the production equipment 2 on the ceiling 22 of the inner chamber 10.

Additionally, a dividing means 23 formed by a suspended wall is provided so as to adjust the second air flow 18, which is clean outside air, and make an efficient supply thereof to the interface box opener 5.

According to this embodiment, because the length of the flow adjusting dividing means 23 is approximately 2 meters from the ceiling, it is not necessary to provide a divider that surrounds the interface box opener 5, and because the FFUs 7 are provided in a row parallel to the operating panel of the production equipment, there is an increase in the introduced outside air in comparison with the first embodiment, and while this is a disadvantage from the standpoint of energy savings, even in the case of using a suspended overhead transport (OHT), which is expected to be useful when 12-inch wafers are introduced, the present invention is expected to be usable.

Another embodiment of the present invention a method for ventilating a cleanroom configured by an inner chamber inside of which are disposed prescribed semiconductor device production equipment, a movable interface box with a plurality of wafers therewithin, and an interface box opener, fixed on the interface box, which transports wafers to within the production equipment from within the interface box, and an outer chamber which surrounds the inner chamber, and which forms an air circulation path between it and the inner chamber, whereby air inside the inner chamber circulates in the air circulation path via a fan filter unit provided in the inner chamber, a clean second air flow, independent from the first air flow, circulating in the inner chamber and air circulation path, being directly supplied to a region near the interface box opener from the outside of the cleanroom.

In the above-noted method of ventilation for a cleanroom, it is desirable that an air exhaust port of an air duct connected to a clean air supply means provided outside the cleanroom be provided and disposed near the interface box opener, and that a dividing means that surrounds the interface box resting on the interface box opener be disposed near the interface box opener.

In another embodiment of a method of ventilation for a cleanroom, the air exhaust port of the air duct connected to the clean air supply means provided outside the cleanroom is connected to the ceiling of the inner chamber of the cleanroom, and a dividing means is provided so as to be suspended from the region of the ceiling to which is connected an air exhaust port of the air duct of the cleanroom, above the location of the interface box opener.

It is desirable that a dividing means be provided in a region near the ceiling in which the air exhaust port is connected, and also desirable that an interface box transport means be provided within the dividing means.

In a ventilation method for a cleanroom according to the present invention, the first and second air flows are mixed at the inner chamber 10 or the air circulation path, and are supplied for circulation as a first air flow.

In a method of ventilation for a cleanroom according to the present invention, by adopting the above-described technical constitution, because clean air generated using a chemical filter outside of the cleanroom is directly supplied from outside the cleanroom at all times, it is possible to reduce the cost associated with the filter and generating a flow of clean air, and also possible to improve the condition of air in the part of the cleanroom in which cleanliness is most important, thereby not only contributing to the prevention of deterioration of semiconductor device characteristics, but also improving yield.

Thus, in the present invention, while air supplied to the interface box has chemicals removed from it by a chemical filter, only outside air is passed through the chemical filter, so that it is not influenced by chemicals used in processing, or broken down by-products of chemicals contained in the cleanroom atmosphere created because of the chemical filter.

Although all-fresh ventilation requires approximately ten times the amount of handling of outside air as normal, in the present invention because limited supply is done only to the interface box opener 5, it is possible to provide all-fresh ventilation to the required part only, without an extreme increase in the amount of outer air handled.

What is claimed is:

1. A cleanroom comprising:
   an inner chamber comprising therein prescribed semiconductor device production equipment, a movable interface box with a plurality of wafers therewithin, and an interface box opener, fixed on said interface box, which transports wafers to within said production equipment from within said interface box; and
   an outer chamber which surrounds said inner chamber, and which forms an air circulation path between it and said inner chamber,
   wherein a first air flow inside said inner chamber circulates in said air circulation path via a fan filter unit provided in said inner chamber, a clean second air flow, independent from the first air flow circulating in said inner chamber and said air circulation path, being directly supplied to a region near said interface box opener from the outside of said cleanroom.

2. A cleanroom according to claim 1, wherein an air exhaust port of an air exhaust duct connected to a clean air supply means provided outside said cleanroom is provided and disposed near said interface box opener provided in said inner chamber.

3. A cleanroom according to claim 1, comprising a dividing means surrounding said interface box and resting on said interface box opener near interface box opener.

4. A cleanroom according to claim 2, comprising an appropriate filter disposed near a connection between said dividing means and said air exhaust port of said air duct.

5. A cleanroom according to claim 1, comprising a filter means at an appropriate location in said air duct between said air exhaust port and said clean air supply means.

6. A cleanroom according to claim 5, wherein said filter means includes a chemical filter means.

7. A cleanroom according to claim 1, wherein said air exhaust port of said air duct connected to said clean air supply means provided outside said cleanroom is connected to a ceiling of said inner chamber of said cleanroom, and a dividing means is provided so as to be suspended from a region of said ceiling to which is connected said air exhaust port of said air duct of said cleanroom, above the interface box opener.

8. A cleanroom according to claim 7, comprising a fan filter unit at a connection position between said air exhaust port of said air duct and said ceiling of said cleanroom.

9. A cleanroom according to claim 7, comprising an interface box transport means inside said dividing means.

10. A cleanroom according to claim 1, wherein said first and second air flows are mixed at said inner chamber or said air circulation path and supplied for circulation as a first air flow to said inner chamber.

11. A cleanroom according to claim 1, comprising an inner chamber air exhaust means, which, upon detection of an air pressure inside said inner chamber and an air pressure outside of said cleanroom, exhausts part of the air in said air circulation path in response to the difference between said pressures.

12. A cleanroom according to claim 1, comprising an air cooling means in said air circulation path.

13. A method for ventilation of a cleanroom comprising:
   an inner chamber comprising therein prescribed semiconductor device production equipment, a movable interface box with a plurality of wafers therewithin, and an interface box opener, fixed on said interface box, which transports wafers to within said production equipment from within said interface box; and
   an outer chamber which surrounds said inner chamber, and which forms an air circulation path between it and said inner chamber,
   wherein air inside said inner chamber circulates in said air circulation path via a fan filter unit provided in said inner chamber, a clean second air flow, independent from the first air flow circulating in said inner chamber and said air circulation path, being directly supplied to a region near said interface box opener from the outside of said cleanroom.

14. A method for ventilation of a cleanroom according to claim 13, wherein an air exhaust port of an air exhaust duct connected to a clean air supply means provided outside said cleanroom is provided and disposed near said interface box opener provided in said inner chamber, and wherein said clean air is directly supplied to a region near said interface box opener.

15. A method for ventilation of a cleanroom according to claim 13, comprising a dividing means surrounding said interface box and resting on said interface box opener near said interface box opener.

16. A method for ventilation of a cleanroom according to claim 13, comprising an appropriate filter near a connection between said dividing means and said air exhaust port of said air duct.

17. A method for ventilation of a cleanroom according to claim 13, comprising a filter means at an appropriate location in said air duct between said air exhaust port and said clean air supply means.

18. A method for ventilation of a cleanroom according to claim 17, wherein said filter means includes a chemical filter means.

19. A method for ventilation of a cleanroom according to claim 13, wherein said air exhaust port of said air duct connected to said clean air supply means provided outside said cleanroom is connected to a ceiling of said inner chamber of said cleanroom, and wherein a dividing means is provided so as to be suspended from a region of said ceiling to which is connected said air exhaust port of said air duct of said cleanroom, above the interface box opener.

20. A method for ventilation of a cleanroom according to claim 19, comprising a dividing means in a region near said ceiling to which said air exhaust port of said air duct is connected.

21. A method for ventilation of a cleanroom according to claim 20, comprising an interface box transport means in said dividing means.

22. A method for ventilation of a cleanroom according to claim 13, wherein said first and second air flows are mixed at said inner chamber or said air circulation path and supplied for circulation as a first air flow to said inner chamber.

23. A method for ventilation of a cleanroom according to claim 13, comprising an inner chamber air exhaust means, which, upon detection of an air pressure inside said inner chamber and an air pressure outside of said cleanroom, exhausts part of the air in said air circulation path in response to the difference between said pressures.

* * * * *